US006579472B2

(12) United States Patent
Chung et al.

(10) Patent No.: US 6,579,472 B2
(45) Date of Patent: Jun. 17, 2003

(54) CORROSION INHIBITING SOL-GEL COATINGS FOR METAL ALLOYS

(75) Inventors: Young Jin Chung, Calabassas, CA (US); Samuel Lee Jeanjaquet, Thousand Oaks, CA (US); Martin W. Kendig, Thousand Oaks, CA (US)

(73) Assignee: The Boeing Company, Seattle, WA (US)

( * ) Notice: Subject to any disclaimer, the term of this patent is extended or adjusted under 35 U.S.C. 154(b) by 83 days.

(21) Appl. No.: 09/917,089

(22) Filed: Jul. 27, 2001

(65) Prior Publication Data

US 2003/0024432 A1 Feb. 6, 2003

(51) Int. Cl.$^7$ .................. C23F 11/10; C23F 11/167; C23F 11/00
(52) U.S. Cl. ................ 252/389.31; 252/389.1; 252/389.2; 252/389.41; 252/389.52; 106/14.41; 427/387; 427/435
(58) Field of Search .................. 252/389.2, 389.23, 252/389.31, 389.4, 389.41, 389.52, 389.1, 400.2, 400.23, 400.31, 400.4, 400.41, 400.52; 106/14.05, 14.13, 14.41, 287.19, 14.14; 516/99, 104, 100, 117; 501/12; 427/387, 435

(56) References Cited

U.S. PATENT DOCUMENTS

| | | | | |
|---|---|---|---|---|
| 4,753,827 A | | 6/1988 | Yoldas et al. | |
| 4,754,012 A | * | 6/1988 | Yoldas et al. | ........... 528/10 |
| 5,028,489 A | * | 7/1991 | Kissel | ........... 428/469 |
| 5,175,027 A | * | 12/1992 | Holmes-Farley et al. | ... 427/387 |
| 5,182,143 A | * | 1/1993 | Holmes-Farley et al. | ... 427/409 |
| 5,759,244 A | | 6/1998 | Tomlinson | |
| 5,789,085 A | * | 8/1998 | Blohowiak et al. | ........ 428/450 |
| 5,814,137 A | | 9/1998 | Blohowiak et al. | |
| 5,849,110 A | * | 12/1998 | Blohowiak et al. | ........ 148/247 |
| 5,866,652 A | | 2/1999 | Hager et al. | |
| 5,869,140 A | | 2/1999 | Blohowiak et al. | |
| 5,869,141 A | | 2/1999 | Blohowiak et al. | |
| 5,939,197 A | | 8/1999 | Blohowiak et al. | |
| 5,958,115 A | | 9/1999 | Bottcher et al. | |
| 5,958,578 A | * | 9/1999 | Blohowiak et al. | ........ 428/336 |
| 5,964,928 A | | 10/1999 | Tomlinson | |
| 6,008,285 A | | 12/1999 | Kasemann et al. | |
| 6,037,060 A | * | 3/2000 | Blohowiak et al. | ........ 428/450 |
| 6,077,885 A | | 6/2000 | Hager et al. | |
| 6,096,437 A | | 8/2000 | Soucek et al. | |
| 6,124,039 A | | 9/2000 | Goetz et al. | |
| 6,372,027 B1 | * | 4/2002 | Tomaiuolo et al. | ...... 106/14.42 |

* cited by examiner

Primary Examiner—Joseph D. Anthony
(74) Attorney, Agent, or Firm—Alston & Bird LLP

(57) ABSTRACT

An anti-corrosive sol-gel that is a combination of an organometallic salt, an organosilane, and a borate, phosphate, or zinc functional component. The organosilane component may be selected from a large group of equivalent compounds but is preferably an alkoxyzirconium salt, and most preferably Zr (IV) n-propoxide. The organosilane may also be selected from a large group of equivalent compounds, but is preferably 3-glycidoxypropyltrimethoxysilane (GTMS). Combination of the components takes place in the presence of an organic catalyst, preferably acetic acid.

11 Claims, 1 Drawing Sheet

Phosphate, ZnO and borate - response compares with Cr(VI)

US 6,579,472 B2

CORROSION INHIBITING SOL-GEL COATINGS FOR METAL ALLOYS

FIELD OF THE INVENTION

The present invention relates to sol-gel coatings which promote the adhesion of resinous material to a metallic surface. More particularly, the present invention relates to an anti-corrosive sol-gel coating which promotes the adhesion of resinous material to an aluminum or titanium surface.

BACKGROUND OF THE INVENTION

Various coatings have been developed which promote the adhesion of one or more resinous layers to a titanium, aluminum, or other metallic surface such as that used as part of an airplane body.

Some of the coatings improve adhesion by utilizing a sol-gel film between the metal and the resin. The sol-gel films or sol coatings promote adhesion through a hybrid organometallic coupling agent at the metal surface. The metallic portion of the organometallic, which usually contains zirconium, bonds covalently with the metal. The organic portion of the organometallic bonds covalently with the applied layer of adhesive or matrix resin. In this manner, the organometallic based sol-gel creates a metal-to-resin gradient through a monolayer of the organometallic coupling agent.

The strength and durability of the sol coating depends upon chemical and micro-mechanical interactions at the surface of the metal involving, for example, the porosity and microstructure of the metal and the tendency of the sol coating to rehydrate. When properly implemented, the sol coatings provide high temperature surface stability for paint adhesion, adhesive bonding, or fabrication of structurally superior hybrid laminates.

One of the most effective of the organometallic sols, produced by The Boeing Company of Seattle, Wash., is a dilute solution of a stabilized alkoxyzirconium organometallic salt, such as Zr n-propoxide, and an organosilane coupling agent, such as 3-glycidoxypropyltrimethoxysilane (GTMS) that is used with an acetic acid catalyst. This particular formulation is known as Boe-Gel®.

Although the Boe-Gel® sol has superior adhesive properties, the Boe-Gel® sol formulation has only minimal anti-corrosion characteristics. In most situations in which the Boe-Gel® sol is used to adhere a layer of paint, adhesive, or other compound to the metallic surface of an airplane, the material which is adhered to the metallic surface has anti-corrosive properties, and thus protects the metallic surface from corrosion. Problems arise, however, in situations in which the sol-gel coating may become exposed to the environment or may be used alone, in the absence of an anti-corrosive layer.

In the past, chromate compounds have been used to impart anti-corrosive properties to coatings such as the sol-gels discussed above, but chromates have recently come under scrutiny by the Environmental Protection Agency (EPA) for possible health concerns, and new governmental regulations seek to phase out the use of chromates as corrosion inhibitors.

What is needed is a chromate free sol-gel composition providing the same superior metal to resin adhesive and barrier properties as the alkoxyzirconium organometallic salt gels, but which provides the metallic surfaces with significant anti-corrosion properties without the need of an additional anti-corrosive layer.

SUMMARY OF THE INVENTION

The invention is a chromate-free coating which provides superior adhesion, barrier protection, and anti-corrosion properties to a metal surface, and more particularly to an aluminum or titanium surface. The invented coating is an anti-corrosive sol-gel which produces an adhesive film interface between the metal surface and an organic matrix resin or adhesive, and has anti-corrosive properties providing protection for the underlying metal substrate. The invented sol-gel forms a film which promotes adhesion through a hybrid organometallic coupling agent at the metal surface. The anti-corrosive properties of the sol-gel prevent corrosion damage to the covered metal surface even when the sol-gel coating is not covered by an additional resin layer.

The sol-gel is a combination of an organometallic salt, an organosilane, and one or more compounds having borate, zinc, or phosphate functionality. The organometallic component may be selected from a large group of equivalent compounds but is preferably an alkoxyzirconium salt, and most preferably Zr (IV) n-propoxide. The organosilane may also be selected from a large group of equivalent compounds, but is preferably 3-glycidoxypropyltrimethoxysilane (GTMS). Compounds with any borate, zinc, or phosphate functional groups may be used, but phosphates are preferred.

The functional components of the sol-gel are combined with an organic acid prior to application to metal. The organic acid, preferably acetic acid, acts as a catalyst and as a reaction rate regulating agent.

The invention provides a chromate free sol-gel composition providing the same superior metal to resin adhesive and barrier properties as previous alkoxyzirconium sol-gels, but which provides metallic surfaces with significant anti-corrosion properties without the need of an additional anti-corrosive layer.

BRIEF DESCRIPTION OF THE DRAWINGS

Figure 1:
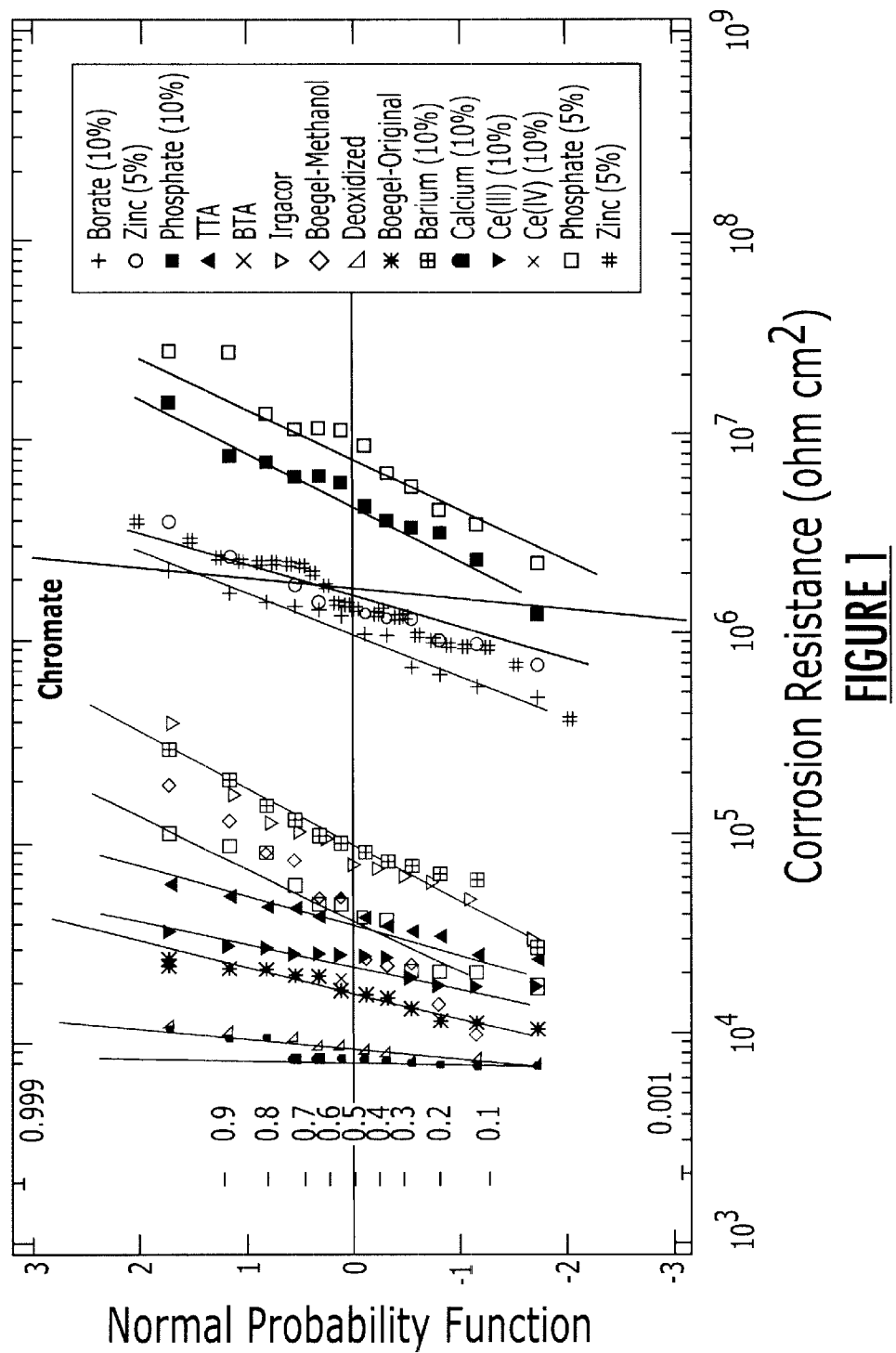

Having thus described the invention in general terms, reference will now be made to the accompanying drawing, which is not necessarily drawn to scale, and wherein:

FIG. 1 is a log normal probability plot of corrosion resistance for populations of test panels of aluminum specimens coated with embodiments of the invented sol-gel containing a variety of borate, zinc, and phosphate functional groups. The corrosion resistance was evaluated from a electrochemical impedance measurement.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The invented anti-corrosive sol-gel includes an organometallic compound, such as an organozirconium compound, and more particularly a Zr (IV) n-propoxide; an organosilane, such as 3-glycidoxypropyltrimethoxysilane (GTMS); and a compound with functionality selected from borate, zinc, or phosphate. The organozirconium compound covalently bonds to the metal surface through the Zr constituent and the organosilane covalently bonds to an organic primer, adhesive, or resin. A borate, zinc, or phosphate containing additive imparts anti-corrosive properties to the sol-gel. Also, an organic acid, preferably acetic acid, is used as a catalyst and reaction rate stabilizer.

The term "sol-gel," a contraction of solution-gelation, refers to a series of reactions where a soluble metal species, typically a metal alkoxide or metal salt, hydrolyzes to form a metal hydroxide. The soluble metal species usually contain organic ligands tailored to correspond with the resin in the bonded structure. The metal hydroxides condense (peptize) in solution to form an hybrid organic/inorganic polymer. Depending on reaction conditions, the metal polymers may condense to colloidal particles or they may grow to form a network gel. The ratio of organics to inorganics in the polymer matrix is controlled to maximize performance for a particular application.

The preferred organometallic compound is an alkoxy metallic compound, and more preferably an alkoxy zirconium compound. The preferred zirconium compounds are of the general formula $Zr(OR)_4$ wherein R is a lower aliphatic having 2–5 carbon atoms, especially normal aliphatic groups. Because of its ready commercial availability, Zr (IV) n-propoxide is particularly preferred as the organometallic compound. Alkoxy metallic compounds having branched aliphatic, alicyclic, or aryl groups also perform satisfactorily. In addition to covalently bonding to the metal surface, the organozirconium compound also serves to minimize the diffusion of oxygen to the surface and to stabilize the metal-resin interface.

Glycidoxysilanes are the preferred organosilanes because of their stability in solution and their ability to crosslink with common, aerospace epoxy or urethane adhesives. The silane is acid-base neutral, so its presence in the sol mixture does not increase the relative hydrolysis and condensation rates of the alkoxy metallic compounds. Sols including the organosilanes are relatively easy to prepare and to apply with reproducible results.

A particularly preferred organosilane for use in the invented sol-gel is 3-glycidoxypropyltrimethoxysilane (GTMS). The GTMS includes an active epoxy group which can react with common epoxy and urethane resins. GTMS does not form strong Lewis acid-base interactions with the hydrated metal oxide substrate. Also, the oxide surface of the metal is more accessible to the zirconium organometallic when GTMS is used as the organosilane, allowing the desired stratification of the sol-gel film in essentially a monolayer with the epoxy groups of the silane coupling agents oriented toward the resin layer. The ideal concentration of the sol depends upon the mode of application. A higher concentration may be preferred for drench or spray applications. Use of GTMS with the zirconium organometallic allows strong covalent bonding to develop between the metal substrate and zirconia and silica, as well as maximizing bonding between the epoxy moiety of the GTMS to the resin layer.

The borate, zinc, and phosphate components provide the invented sol-gel with anti-corrosive properties. It has been found that the borate, zinc, or phosphate functionalities increase the anti-corrosive efficacy of the invented sol-gel up to a hundred times over adhesive sol-gels of the prior art. The anti-corrosion compounds are preferably present in the sol-gel in an amount between about 5 mole % and about 10 mole % with respect to the organometallic and organosilane solids in the sol-gel. Exemplary borate, zinc, and phosphate precursors which may be added to the sol-gel are zinc acetate, triethylphosphate, and boron n-butoxide.

In one embodiment of the sol-gel, the sol-gel comprises a mixture of GTMS, Zr (IV) n-propoxide, and a phosphate component, in a medium of water, methanol, and acetic acid. The GTMS and Zr (IV) n-propoxide are preferably present in a molar ratio between about 2:1 and about 5:1, and most preferably about 5:1. The solids (GTMS and Zr (IV) n-propoxide) comprise about 10% to about 12% of the total mixture, by mass percentage. The phosphate is present in an amount equivalent to between 5 mole % and 10 mole % of the solids, most preferably 5 mole %. The predominate component of the mixture is the methanol, at about 80% by mass. The water and acetic acid components of the mixture respectively comprise about 5% and about 1.5% of the mixture, by mass. A slightly higher concentration of reactants may yield better results in some situations, depending on the bonding materials and conditions. The ratio of GTMS to Zr (IV) n-propoxide may be adjusted to obtain the strongest surface adherence for particular metals, application methods, and types of resin coatings. Trends which may be used to predict sol-gel performance with respect to differing materials and applications are analogous to those of prior non-corrosion resistant sol-gels, see U.S. Pat. Nos. 5,814,137 and U.S. Pat. No. 5,939,197.

The invented sol-gels may be produced as either water-based or alcohol-based mixtures. Previous water-based systems have alleviated flammability, safety, toxicity, and environmental concerns associated with alcohol-based sols, but alcohol-based sols allow better control of the amount of hydrolysis of the sol and exhibit the most favorable anti-corrosive properties when used in combination with the borate, zinc, and phosphate containing compounds. Because of the more favorable anti-corrosive properties, the preferred sol is alcohol-based.

The preferred sol-gel coating is about 20 nm to 500 nm thick and produces a gradient from the metallic surface through the hybrid organometallic sol-gel film to the adhesive or resin matrix layer being applied to the metal. As with the Boe-Gel® sol, the organosilanes in the invented sol-gel covalently bond to or otherwise associate with the organic adhesive resin or primer layer. Covalent bonding also occurs between the metal component of the alkoxy metal and the metal surface at the interface of the sol-gel and metal surface. Thus, the components of the sol-gel form chemical bonds with the metal surface and the applied resin layer.

The organometallic and the organosilane components of the sol-gel hydrolyze at different rates. If the sol is applied too shortly after being made, the organosilane may not be fully hydrolyzed. If the sol is not applied soon enough, the hydrolyzed silicon and organometallic components may condense among themselves, forming oligomers and networks. In the absence of the corrosion inhibitors, the ideal solution age is at the point that the zirconium and silicon are hydrolyzed sufficiently that zirconium and silicon react with the metal surface. However, the compounds added for corrosion protection in the invented sol react with the metal surface to form a stable interface.

In sols containing zirconium alkoxides, the zirconium and silicon components hydrolyze on a similar time scale when the zirconium alkoxide is mixed with glacial acetic acid, which stabilizes the fast reacting four-coordinate zirconate center. Given that the relative rates of the hydrolysis and condensation reactions involved in the sol coating process depend upon the concentrations of the reagents in the reactions, the metal alkoxide selected, and the water available for hydrolysis, the minimum amount of acetic acid necessary to form the zirconium-acetic acid complex is used. By way of example, in the preferred embodiment of the sol having about 10% solids (GTMS and Zr (IV) n-propoxide) in a methanol and water solution, acetic acid is needed in an amount of about 3.5 moles per mole of Zr (IV) n-propoxide.

Other organic acids, such as citric acid, glycols, ethoxyethanol, or $H_2NCH_2CH_2OH$ can be substituted for the acetic acid, though acetic acid is preferred. The acidic catalyst promotes the hydrolysis reaction over condensation while a basic catalyst would do the opposite.

In order to take advantage of the full scope of the favorable adhesive properties provided by the invented anti-corrosive sol-gel, the metal surface must be properly prepared and the sol-gel must be properly applied. Techniques for applying a sol-gel that are equally applicable to the invented anti-corrosive sol-gel are found in Blohowiak et al., U.S. Pat. No. 5,814,137, and are incorporated herein by reference. As a variation to the sol coating process, a stabilizer may be applied to the surface to form a barrier film prior to applying the hybrid organometallic sol to form the sol-gel film.

Alternative organosilane compounds which may be used in accordance with this invention (available from Petrarch or Read) for making the sol are: 3-aminopropyltriethoxysilane, p-aminophenylsilane, allyltrimethoxysilane, n-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, and vinyltrimethoxysilane.

In the organometallics, the organo moiety preferably is aliphatic or alicyclic, and generally is a lower n-alkoxy moiety having 2–5 carbon atoms. Also, the organosilane includes typically an epoxy group for bonding to epoxy or urethane resins or adhesives or a primary amine for bonding to polyimide resins or adhesives.

Alternative alcohols for use in the invented sol are ethanol, isopropanol, or another lower aliphatic alcohol.

Alternative organometallics are cerium, yttrium, titanium, or lanthanum organometallics, such as yttrium acetate trihydrate or other hydrates, yttrium 2-ethylhexanoate, i-proproxyyttrium, methoxyethoxyyttrium, yttrium nitrate, cerium acetate hydrate, cerium acetylacetonate hydrate, cerium 2-ethylhexanolate, i-propoxycerium, cerium stearate, cerium nitrate, lanthanum nitrate hexahydrate, lanthanum acetate hydrate, or lanthanum acetylacetonate. The alternative organometallics may be used together with the zirconium alkoxides or in their place.

Production of the preferred anti-corrosive sol-gel is accomplished by first mixing GTMS and Zr (IV) n-propoxide in a medium of water, methanol, and acetic acid. The GTMS and Zr (IV) n-propoxide are preferably present in a molar ratio of about 5:1. The solids (GTMS and Zr (IV) n-propoxide) preferably comprise about 10% to about 12% of the total mixture, by mass percentage. The predominate component of the mixture is the methanol, at about 80% by mass. The water and acetic acid components of the mixture respectively comprise about 5% and about 1.5% of the mixture, by mass. A slightly higher concentration of reactants may yield better results in some situations, depending on the bonding materials and conditions. The ratio of GTMS to Zr (IV) n-propoxide may be adjusted to obtain the strongest surface adherence for each particular situation.

The base sol-gel mixture is stirred, preferably for 30 minutes or more, to allow for proper dispersion of the solids within the water, alcohol, and acid mixture. After stirring of the sol-gel mixture, the compound containing phosphate, borate, or zinc functionality is added to the base sol-gel and stirred for several hours. The borate, zinc, or preferably phosphate component is preferably added in amounts equivalent to between about 5 mole % and 10 mole % of the solids in the sol-gel. In order to aid the dispersion of the additive in the sol-gel mixture, the phosphates are typically dissolved in either methanol, ethanol, or water as a 10% solution prior to being added to the base sol-gel.

The invented anti-corrosive sol-gel provides dramatically improved anti-corrosive properties over previous sol-gels while maintaining superior adhesive properties between metallic surfaces and resin matrices, and while avoiding the use of environmentally hazardous chromate anti-corrosive compounds.

EXAMPLES

Fifteen 20 g samples of sol-gel having no borate, zinc, or phosphate content ("baseline" samples) were prepared. The 20 g baseline samples were prepared with the following components and in the following amounts:

| Component | | MW | Wt. Unit |
|---|---|---|---|
| Water | | | 0.985 g |
| Methanol | | | 16.43 g |
| GTMS | (3-Glycidoxyprophyl)trimethoxysilane | 236 | 1.643 g |
| Zr alkoxide | 70% Zr n-propoxide in n-propanol | 327 | 0.646 g |
| Acetic Acid | | | 0.296 g |
| | | | 20.0 g |
| Total Solids: | 2.289 g | | |
| Moles Solids: | 0.00835 mole | | |

After combination, the baseline components were stirred for 30 minutes. After thorough mixing of the baseline sol-gel, various borate, zinc, and phosphate containing compounds were added to the baseline samples. Most of the anti-corrosive compounds were added in amounts equivalent to either 5% or 10% with respect to the molar amount of solids present in the baseline sol-gel, i.e. the total molar amount of GTMS and Zr (IV) n-propoxide present in the sol-gel. Prior to addition to the sol-gel, the anti-corrosive compounds were dissolved in either methanol, ethanol, IPA, or water to make 10% solutions on a mass basis. The actual amounts of the anti-corrosive compounds added to the sol-gel are as follows:

| Additive | Precursor | Commercially Available From/As | g of a 10% soln Added to 20 g of Baseline | % With Respect to Solids |
|---|---|---|---|---|
| Irgacore252 | 1BTA2SA | Ciba | 0.6867/MeOH | 3 wt % |
| BaO | Ba isopropoxide 20% | Gelest #AKB121 | 5.327/IPA | 5 mol % |
| BTA | Benzotriazole | Aldrich B1, 140–0 | 0.994/MeOH | 10 mol % |
| BO4 | Boron n-butoxide | Gelest #AKB155 | 1.92/MeOH | 10 mol % |
| CaO | Ca methoxyethoxide 20% | Gelest AKC167 | 3.97/2-MeOEtOH | 5 mol % |
| Ce(III) | Ce acetate | Alfa #11324 | 2.87/Water | 10 mol % |
| Ce(IV) | Ce methoxyethoxide 20% | Gelest AKC186 | 18.39/2-MeOEtOH | 10 mol % |
| Phosphate | Triethylphosphate | Alfa #40001 | 1.52/Water | 10 mol % |
| Phosphate | Triethylphosphate | Alfa #40001 | 0.76/Water | 5 mol % |
| TTA | Tolyltriazole | Aldrich 19,630–4 | 1.11/Water | 10 mol % |
| ZnO | Zn acetate | Baker 1–4296 | 0.916/Water | 5 mol % |
| ZnO | Zn acetate | Baker 1–4296 | 1.832/Water | 10 mol % |

The sol-gel samples were mechanically stirred for at least two hours to ensure adequate dispersion of the solid components within the sol-gel. After stirring, 3"×3"

The sol-gel samples were mechanically stirred for at least two hours to ensure adequate dispersion of the solid components within the sol-gel. After stirring, 3"×3" test panels of deoxidized aluminum 2024-T3 were spin coated with the various sol-gel samples at 300 rpm and then dried at 100° C. for 1 to 2 hours.

After drying, the test panels were subjected to electrochemical screening, a process common to the field of aluminum alloys. Under the screening, the various samples are subjected to an electrochemical impedance spectroscopy test in which the resistance (ohm·cm$^2$) of each panel is evaluated from an analysis fo the electrochemical impedance spectrum. The analysis allows evaluation of a corrosion resistance. For each inhibitor evaluated, 10 to 12 specimens were exposed to 0.5 M NaCl for 24 hours at which time evaluation of the corrosion resistance from the impedance spectra were observed. The resulting corrosion resistances from the specimens were plotted as a log normal probability plot shown in FIG. 1. The mean value for each formulation is determined from the 0.5 probability point on the plot where the probability function equals 0. The higher the mean corrosion resistance obtained from the data plotted in FIG. 1, the better is the predicted performance of the coating. Based upon the measured resistance, probable corrosion of the aluminum alloy during a salt spray test can be predicted. More information on the correlation can be found in "A correlation between salt spray and electrochemical impedance spectroscopy test results for conversion-coated aluminum", Buchheit, R. G., Corrosion, Vol. 54, No. 1, Pp 61–72, Jan 1998.

Results of the electrochemical screening were plotted with reference to the known electrochemical properties of a sol-gel having a traditional chromate anti-corrosive additive. The results are shown in FIG. 1. As seen, the sol-gel with the 10% borate and 5% zinc additives had corrosion resistance approximating that of the sol-gel with the chromate additives. The sol-gel with the 5% and 10% phosphate additives actually provided significantly higher corrosion resistance than those with chromate additives. Thus, all tested sol-gels having borate, zinc, or phosphate additives exhibited increased anti-corrosive properties over a baseline GTMS and Zr (IV) n-propoxide sol-gel composition. Baseline sol-gels having between 5% mol and 10% mol solids of phosphate additives exhibited anti-corrosive properties greater than comparable sol-gels treated with chromate additives.

The invention provides a chromate free sol-gel composition providing the same superior metal to resin adhesive and barrier properties as previous alkoxyzirconium sol-gels, but which provides metallic surfaces with significant anti-corrosion properties without the need of an additional anti-corrosive layer.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A chromate-free anti-corrosive sol-gel for use in coating metal surfaces which provides an improved adhesion layer for subsequent surface coatings, said treatment comprising:

an organometallic;

an organosilane;

an organic acid; and, an anti-corrosion compound having functionality selected from the group consisting of borates, phosphates, zinc, and combinations thereof, wherein the anti-corrosion compound is present in an amount between about 5 mol % and about 10 mol % with respect to the combined organometallic and organosilane content of the sol-gel.

2. The surface treatment of claim 1 wherein the organometallic is selected from the group consisting of an alkoxyzirconium, yttrium acetate trihydrate, yttrium 2-ethylhexanoate, i-proproxyttrium, methoxyethoxyttrium, yttrium nitrate, cerium acetate hydrate, cerium acetylacetonate hydrate, cerium 2-ethylhexanolate, i-propoxycerium, cerium stearate, cerium nitrate, lanthanum nitrate hexahydrate, lanthanum acetate hydrate, lanthanum acetylacetonate and mixtures thereof.

3. The surface treatment of claim 2 wherein the organosilane is selected from the group consisting of 3-aminopropyltriethoxysilane, 3-glycidoxypropyltrimetheoxysilane, p-aminophenylsilane, allyltrimethoxysilane, n-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-mercaptopropyltrimethoxysilane, 3-mercaptopropyltriethoxysilane,
3-methacryloxypropylmethyldiethoxysilane,
3-methacryloxypropylmethyldimethoxysilane,
3-methacryloxypropyltrimethoxysilane,
n-phenylaminopropyltrimethoxysilane,
vinylmethyldiethoxysilane, vinyltriethoxysilane, vinyltrimethoxysilane, and mixtures thereof.

4. The surface treatment of claim 3 wherein the organosilane is 3-Glycidoxypropyltrimethoxysilane (GTMS).

5. The surface treatment of claim 2 wherein the organometallic is an alkoxyzirconium.

6. The surface treatment of claim 5 wherein the alkoxyzirconium is Zr (IV) n-propoxide.

7. The surface treatment of claim 6 wherein the added compound is a phosphate.

8. The surface treatment of claim 6, wherein GTMS and Zr (IV) n-propoxide are present in a molar ratio between about 2:1 and about 5:1.

9. The surface treatment of claim 6, wherein the organic acid is acetic acid.

10. The surface treatment of claim 6, wherein the GTMS and Zr (IV) n-propoxide are dissolved in an alcohol.

11. A chromate-free anti-corrosive surface treatment comprising
   a) about 7.0 wt % to about 9.0 wt % 3-glycidoxyprophyltrimethoxysilane;
   b) about 1.0 wt % to about 3.0 wt % Zr (LV) n-propoxide;
   c) about 0.5 wt % to about 1.5 wt % acetic acid;
   d) about 2.5 wt % to about 7.5 wt % water;
   e) about 77.0 wt % to about 88.2 wt % methanol; and
   f) about 0.2 wt % to about 2.0 wt % of a phosphate containing compound.

* * * * *

UNITED STATES PATENT AND TRADEMARK OFFICE
CERTIFICATE OF CORRECTION

PATENT NO.    : 6,579,472 B2
DATED         : June 17, 2003
INVENTOR(S)   : Chung et al.

It is certified that error appears in the above-identified patent and that said Letters Patent is hereby corrected as shown below:

<u>Column 10,</u>
Line 9, "(LV)" should read -- (IV) --.

Signed and Sealed this

Ninth Day of September, 2003

JAMES E. ROGAN
*Director of the United States Patent and Trademark Office*